(12) United States Patent
Chu

(10) Patent No.: US 8,778,718 B2
(45) Date of Patent: Jul. 15, 2014

(54) METHOD OF MANUFACTURING DYE SENSITIZED SOLAR BATTERY AND SOLAR BATTERY ASSEMBLING APPARATUS FOR THE SAME

(71) Applicant: Electronics and Telecommunications Research Institute, Daejeon (KR)

(72) Inventor: Moo Jung Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/667,009

(22) Filed: Nov. 2, 2012

(65) Prior Publication Data

US 2013/0189811 A1    Jul. 25, 2013

(30) Foreign Application Priority Data

Jan. 19, 2012 (KR) .......................... 10-2012-0006226

(51) Int. Cl.
*H01L 21/00* (2006.01)
*H01L 31/05* (2014.01)
*H01L 31/18* (2006.01)
*H01L 31/0224* (2006.01)

(52) U.S. Cl.
CPC ............... *H01L 31/05* (2013.01); *H01L 31/18* (2013.01); *H01L 31/0504* (2013.01); *H01L 31/022425* (2013.01)

USPC ............. 438/64; 438/67; 438/98; 257/E31.11

(58) Field of Classification Search
CPC . H01L 31/05; H01L 31/0504; H01L 31/0508; H01L 31/18; H01L 31/022425; H01G 9/2081
USPC ........................... 438/67, 64, 98; 257/E31.11
IPC .. H01L 31/05, 31/0504, 31/0508; H01G 9/2081
See application file for complete search history.

(56) References Cited

U.S. PATENT DOCUMENTS

| 2005/0073818 | A1* | 4/2005 | Hirano et al. ................. 361/763 |
| 2007/0238826 | A1* | 10/2007 | Fischer et al. ................. 524/496 |
| 2009/0111206 | A1* | 4/2009 | Luch ............................. 438/59 |
| 2011/0126879 | A1* | 6/2011 | Kitamura et al. ............. 136/244 |

FOREIGN PATENT DOCUMENTS

| JP | 1993-145103 A | 6/1993 |
| JP | 2002-094087 A | 3/2002 |
| KR | 10-2009-0118327 A | 11/2009 |
| KR | 10-2010-0071764 A | 6/2010 |
| KR | 10-2011-0001344 A | 1/2011 |

* cited by examiner

*Primary Examiner* — Michael Trinh
(74) *Attorney, Agent, or Firm* — Rabin & Berdo, P.C.

(57) ABSTRACT

Disclosed are a method of manufacturing a dye sensitized solar battery and a solar battery assembling apparatus. The method includes: forming electrode pads on electrodes of respective solar battery sub modules; applying a conductive adhesive on the electrode; and overlapping the electrodes of the solar battery sub modules, applying a current to the electrode pads, and then heating and hardening the conductive adhesive.

2 Claims, 7 Drawing Sheets

METHOD OF MANUFACTURING DYE SENSITIZED SOLAR BATTERY AND SOLAR BATTERY ASSEMBLING APPARATUS FOR THE SAME

CROSS-REFERENCE TO RELATED APPLICATIONS

This application is based on and claims priority from Korean Patent Application No. 10-2012-0006226, filed on Jan. 19, 2012, with the Korean Intellectual Property Office, the disclosure of which is incorporated herein in its entirety by reference.

TECHNICAL FIELD

The present disclosure relates to a dye sensitized solar battery, and more particularly, to a method of configuring a dye sensitized solar battery by connecting dye sensitized solar battery cells to each other and a solar battery assembling apparatus for the same.

BACKGROUND

A solar battery is an apparatus for generating an electric energy by absorbing light (including sun light) and converting an optical energy of the light to an electric energy.

FIG. 1 is a diagram illustrating a basic structure of a general solar battery cell.

Referring to FIG. 1, the solar battery cell includes a positive electrode glass substrate 110 coated with a positive electrode 112, a negative electrode glass substrate 120 coated with a negative electrode 122, a catalyst layer 114 applied on the positive electrode 112 with a thin thickness corresponding to a level of an atomic layer thin film, a $TiO_2$ layer 124 attached to a lower surface of the negative electrode 122 with a dye absorbed thereto, and sealants 140 for sealing an electrolyte 130 between the positive electrode 112 and the negative electrode 122 while maintaining an interval between the positive electrode 112 and the negative electrode 122 so as to prevent the positive electrode 112 and the negative electrode 122 from coming into contact with each other.

A voltage of an electric energy generated by one solar battery cell is generally about 1.0 V, so that, in order to generate a voltage and a current in a practical level, multiple solar battery cells are connected in series so as to increase the voltage.

A dye sensitized solar battery is formed by configuring solar battery sub modules connected in series by integrating a plurality of dye sensitized unit solar battery cells on one glass substrate and then connecting the solar battery sub modules to each other in series or in parallel. The dye sensitized solar battery may include a frame and a protection cover serving a protection function and a support function depending on a necessity.

FIG. 2 is a diagram illustrating a general structure of a solar battery sub module integrated on a single substrate.

Referring to FIG. 2, the negative electrode 122 of the solar battery cell is connected to the positive electrode 112 of the adjacent solar battery cell through partition walls 150 functioning as both a sealant and an electrical insulation between the solar battery cells, so as to form an electrically series-connected circuit. The plurality of solar battery cells is integrated, to form one solar battery sub module.

FIG. 3 is a diagram illustrating a method of manufacturing the dye sensitized solar battery by connecting the plurality of solar battery sub modules to each other.

Referring to FIG. 3, the positive electrode glass substrate 110 and the negative electrode glass substrate 120 protrude from both ends of the solar battery sub module, and the positive electrode 112 and the negative electrode 122 are coated on an upper surface of the protruding positive electrode glass substrate 110 and the lower surface of the protruding negative electrode glass substrate 120, respectively.

The protruding positive electrode 112 and the protruding negative electrode 122 are connected while overlapping each other, and the protruding positive electrode 112 and the protruding negative electrode 122 are coupled by using a conductive adhesive 310 in order to improve the electrical characteristic. In this case, the connection of the necessary number of solar battery sub modules in series is referred to as a string, and the dye sensitized solar battery is manufactured by connecting the necessary number of strings in parallel.

FIG. 4 is a diagram illustrating a method generally used in the electrical connection between the solar battery sub modules.

Referring to FIG. 4, one end of a metal tape 410 is connected to one end of the protruding negative electrode 122 of the solar battery sub module by a means, such as a soldering, and the other end of the metal tape 410 is connected to the protruding positive electrode 112 of the solar battery sub module to be connected, so as to form the electrical series-connection.

According to the existing method, there are advantages in that the electrical connection may be possible through only a simple manual operation, and a used material is relatively cheap.

However, the conventional method of electrically connecting the solar battery sub modules has low location accuracy between the solar battery sub modules which are connected to each other, so that an error of an appearance of the dye sensitized solar battery is increased, it is difficult to secure strength and durability of a connection part, so that an additional supporting structure needs to be used, and the respective solar battery sub modules are separately soldered, so that quality uniformity is deteriorated and the method is not appropriate for mass production through an automation.

As a method of solving the problems, as illustrated in FIG. 3, if the electrodes of the solar battery sub module are bonded to each other by using the conductive adhesive 310 having excellent electrical conductivity and excellent durability and mechanical strength, the dye sensitized solar battery having excellent performance and high reliability may be manufactured.

That is, when the conductive adhesive 310 are applied on the electrodes of the solar battery sub module so as to couple the electrodes to each other, and then conductive adhesive 310 is hardened in a state where the electrodes of the solar battery sub module are fixed so as not to move, the connection part is mechanically fixed and simultaneously electrically connected.

Although there are several kinds of conductive adhesives 310, when low resistance loss and high reliability for a long term are demanded like the electrode connection of the solar battery sub module, an epoxy resin-based metal paste is mainly used.

The metal paste is generally hardened at a high temperature. The metal paste is a non-conductor or has a high resistance value before the metal paste hardens, but represents a very low resistance value and has a characteristic of excellent mechanical strength and durability after the metal paste is hardened.

In the meantime, since the dye sensitized solar battery includes a liquid electrolyte, the performance of the dye sensitized solar battery may be deteriorated or destroyed when the dye sensitized solar battery is in a high-temperature state. Accordingly, a selective heating of only a corresponding region is needed in a process of heating the electrode part at a high temperature for the hardening of the metal paste in order to prevent the dye sensitized solar battery from being damaged. The local heating method may use a laser heating method, a high frequency induction heating method, and a resistive heating method, and in order to prevent a temperature increase due to heat conduction, a local cooling may be used together depending on the necessity.

FIG. 5 is a diagram illustrating a method of heating the conductive adhesive by using the resistive heating method.

Referring to FIG. 5, a heating wire 510 is laid on the electrode 112 of the solar battery sub module, and the conductive adhesive 310 is applied in a thickness equal to or larger than that of the heating wire 510. The electrode 122 of the solar battery sub module desired to be connected overlaps the conductive adhesive 310. Then, when a current flows in the heating wire 510 so as to generate heat, the conductive adhesive 310 is heated and hardened, so that the solar battery sub modules are fixed to each other. In this case, in order to prevent the temperature increase by the heat conduction, the local cooling may also be used together depending on the necessity. Further, instead of the metal heating wire, a heating wire in a form of a thin film may be attached to and formed in the electrode for use.

However, when the separate heating wire is used as described above, a thickness of the region to which the electrode is attached cannot be smaller than that of the used heating wire and a separate heating wire or a heating wire deposition process and a material are required.

Since the electrode of the solar battery sub module is a thin film having conductivity, the electrode may be heated by making a current directly flow in the electrode. However, when a high current is applied so as to heat the electrode up to a hardening temperature of the conductive adhesive, the electrode in the form of the thin film may be damaged, and an excessively wide area, as well as the region coated with the conductive adhesive, may be heated depending on a type of the electrode.

SUMMARY

In a case where the electrodes of the solar battery sub module are connected to each other in order to form the dye sensitized solar battery, a current of several amperes A to several tens of amperes A is required to be able to flow in the connection part, a resistance value of the connection part is required to be low so that a loss of power has to be small, and the connection part is required to have sufficient mechanical strength and durability, so as to secure reliability of the dye sensitized solar battery in long-term use.

Further, the manufacturing process is not only required to be simple, easily automated, and appropriate for mass production, but economic feasibility is also required to be improved by use of a low-cost material.

The present disclosure has been made in an effort to provide a method of manufacturing a dye sensitized solar battery having excellent performance and high reliability by bonding electrodes of solar battery sub modules by using a conductive adhesive, and a solar battery assembling apparatus for the same.

An exemplary embodiment of the present disclosure provides a method of manufacturing a dye sensitized solar battery, including: forming electrode pads on electrodes of respective solar battery sub modules; applying a conductive adhesive on the electrode; and overlapping the electrodes of the solar battery sub modules, applying a current to the electrode pads, and then heating and hardening the conductive adhesive.

Another exemplary embodiment of the present disclosure provides a solar battery assembling apparatus for connecting and fixing a plurality of solar battery sub modules by using a conductive adhesive obtaining conductivity and mechanical strength by heating, the solar battery assembling apparatus including: an amperemeter for measuring a current flowing in an electrode of a solar battery sub module; a voltmeter for measuring a voltage applied to the electrode of the solar battery sub module; and a power unit for confirming a hardened state of the conductive adhesive by monitoring the current flowing in the electrode of the solar battery sub module and the voltage applied to the electrode of the solar battery sub module by using the amperemeter and the voltmeter, and adjusting heating power before the conductive adhesive hardens and heating power until the conductive adhesive hardens.

Accordingly, the aforementioned present disclosure provides a method of manufacturing a dye sensitized solar battery in which electrodes of a plurality of solar battery sub modules are bonded to each other by using a conductive adhesive, and a solar battery assembling apparatus for the same, so that it is possible to easily connect and fix the solar battery sub modules and improve mechanical strength, an electrical characteristic, and durability of the dye sensitized solar battery.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. In describing the present disclosure, a detailed description of related known configurations and functions will be omitted when it may make the essence of the present disclosure obscure.

When a current is directly applied to electrodes of solar battery sub modules, a large amount of current is concentrated to a narrow contact surface or arc discharge is generated, so that the electrodes may be damaged. In order to prevent the damage of the electrode, an area contacting the electrode needs to be wide so as to reduce a current density and reduce contact resistance.

Accordingly, in an exemplary embodiment of the present disclosure, in order to prevent an excessively wide area from being heated and selectively heat only a region on which a conductive adhesive is applied, electrode pads are formed in an electrode of the solar battery sub module, thereby limiting a range of a current flowing for the heating.

Figure 1:
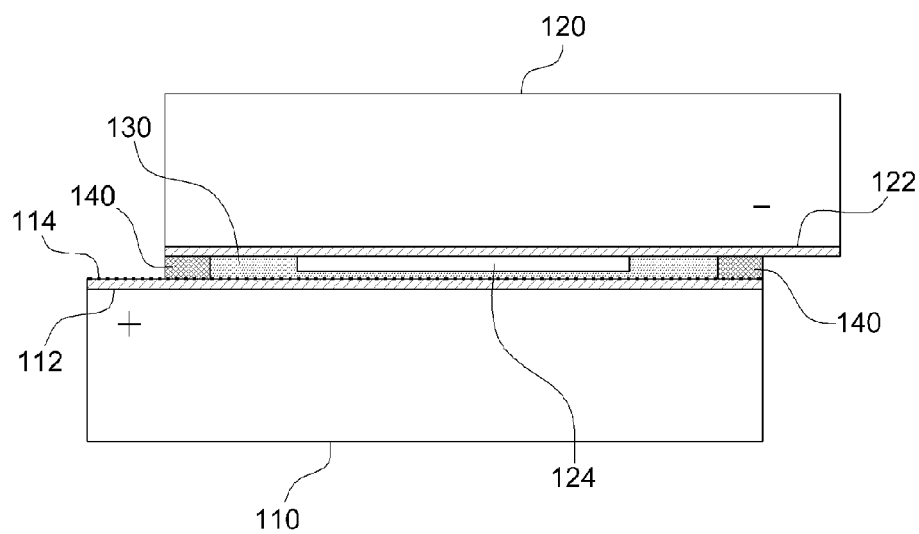
FIG. 1 is a diagram illustrating a basic structure of a general solar battery cell.
Figure 2:
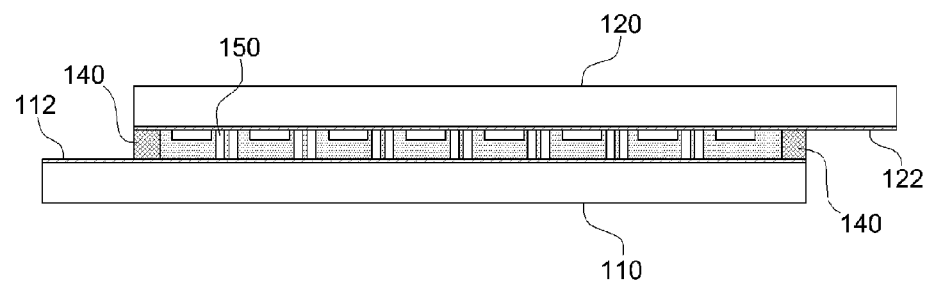
FIG. 2 is a diagram illustrating a general structure of a solar battery sub module integrated on a single substrate.
Figure 3:
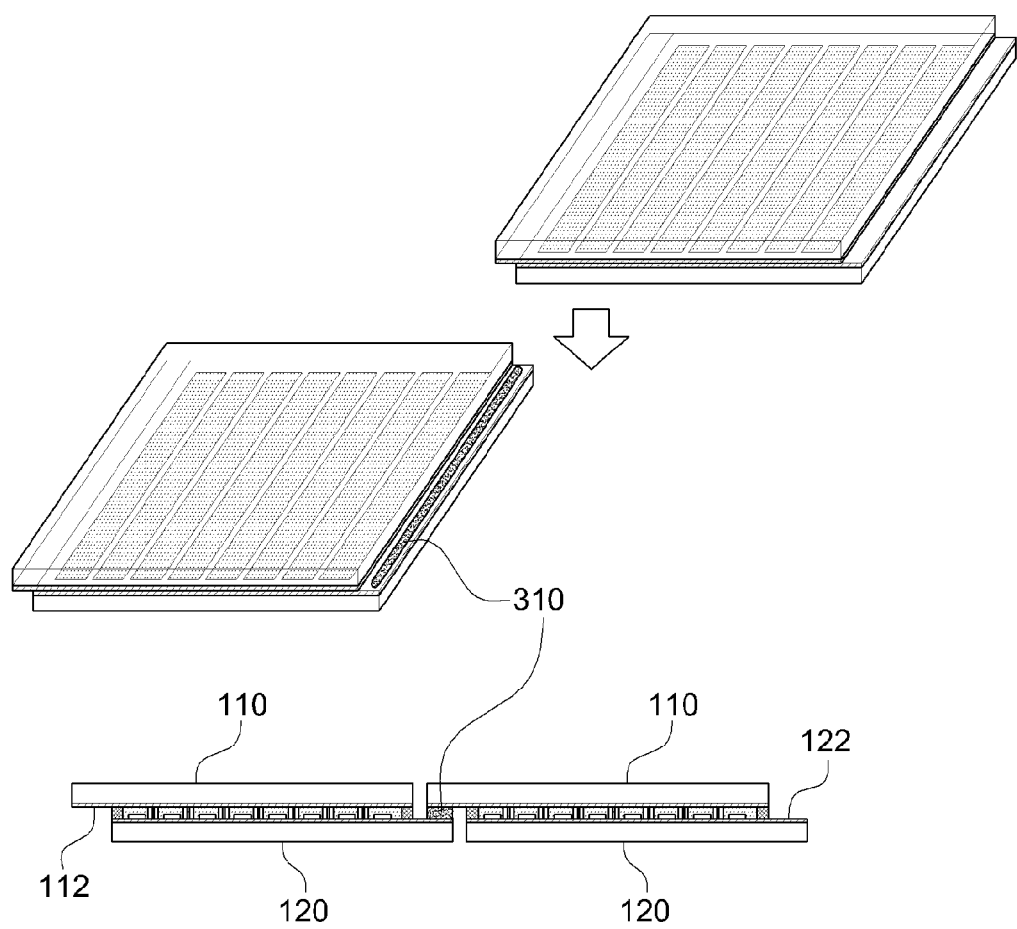
FIG. 3 is a diagram illustrating a method of manufacturing a dye sensitized solar battery by connecting a plurality of solar battery sub modules to each other.
Figure 4:
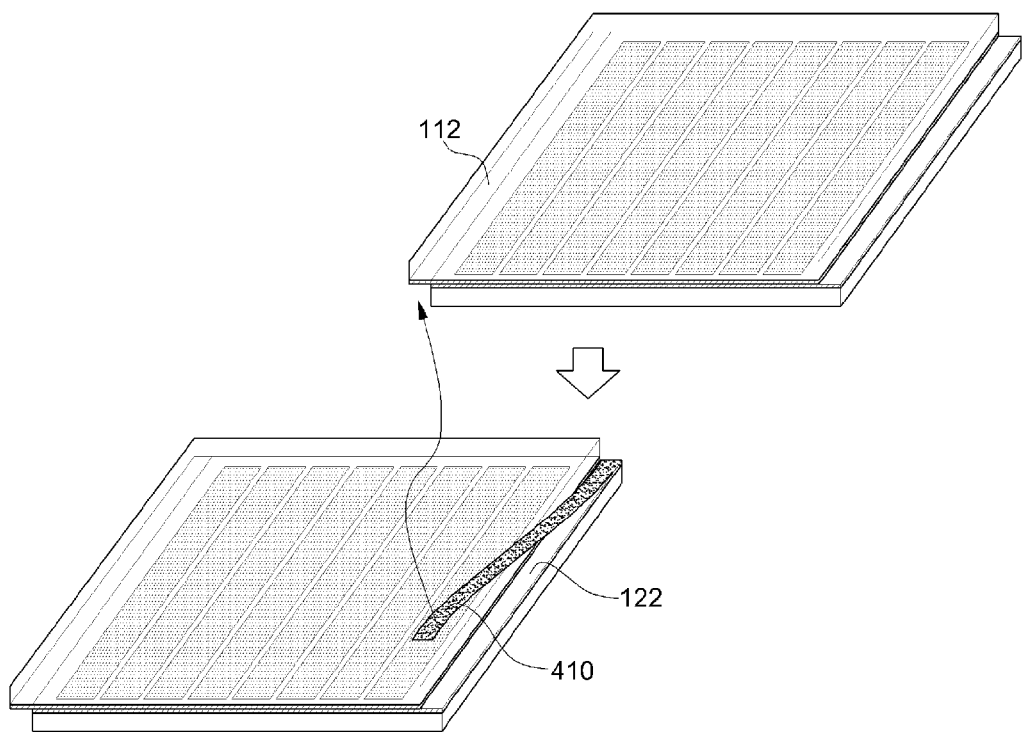
FIG. 4 is a diagram illustrating a method generally used in an electrical connection between solar battery sub modules.
Figure 5:
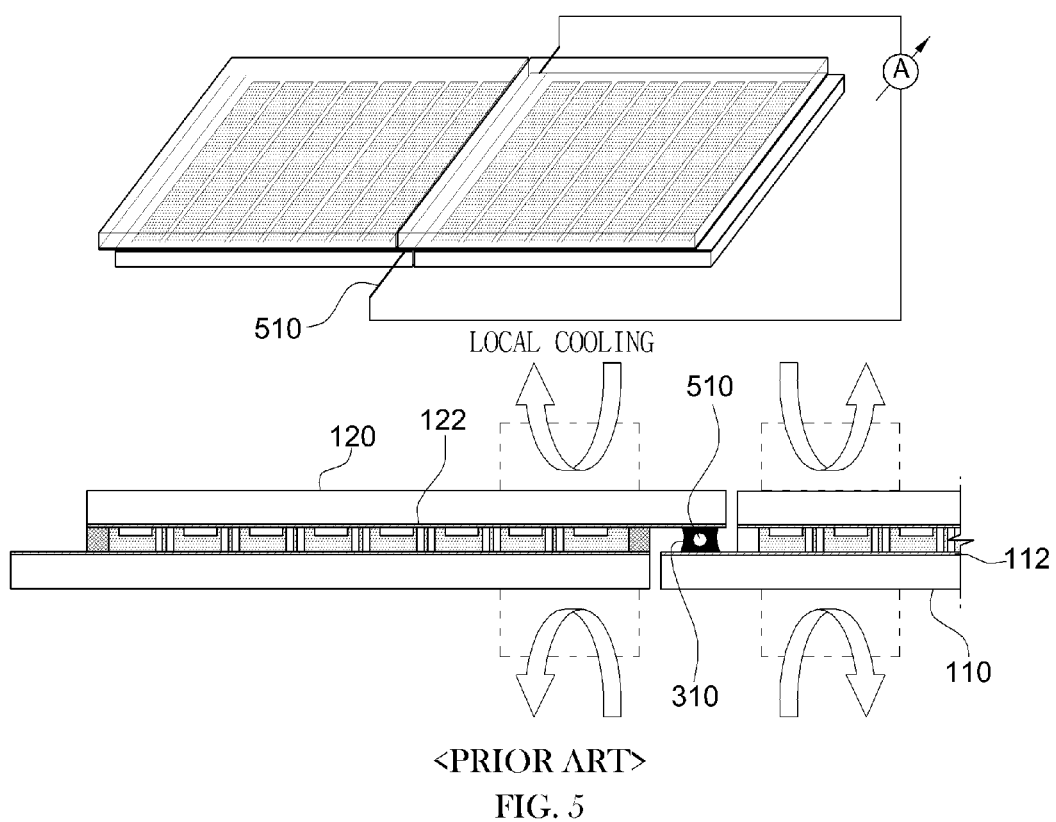
FIG. 5 is a diagram illustrating a method of heating a conductive adhesive by using a resistive heating method.
Figure 6:
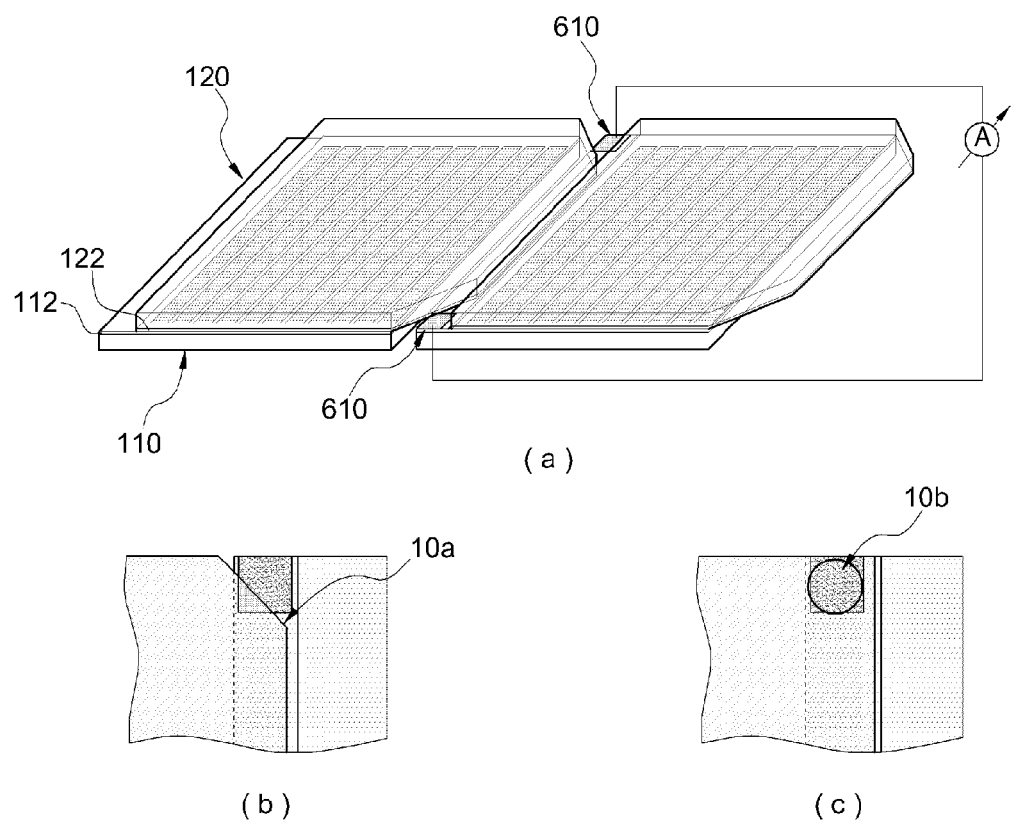
FIGS. 6A to 6C are diagrams illustrating a method of applying a current to an electrode pad after forming the electrode pad in an electrode of a solar battery sub module.

FIGS. 6A to 6C are diagrams illustrating a method of applying a current to the electrode pads after forming the electrode pads in the electrode of the solar battery sub module.

Referring to FIG. 6A, the electrode pads 610 are formed by applying a metal paste having good electrical conductivity to or depositing a metal material on the positive electrode 112 of the positive electrode glass substrate 110 or the negative electrode 122 of the negative electrode glass substrate 120.

Further, an opening for supplying a current to the electrode pad 610 may be formed by cutting an edge 10a of the glass substrate 110 or 120 of the solar battery sub module as illustrated in FIG. 6B, or piercing a hole 10b in the glass substrate 110 or 120 of the solar battery sub module as illustrated in FIG. 6C.

FIGS. 7A to 7D are diagrams illustrating a method of applying the conductive adhesive after forming a pattern for limiting a heated region in the electrode of the solar battery sub module.

Figure 7:
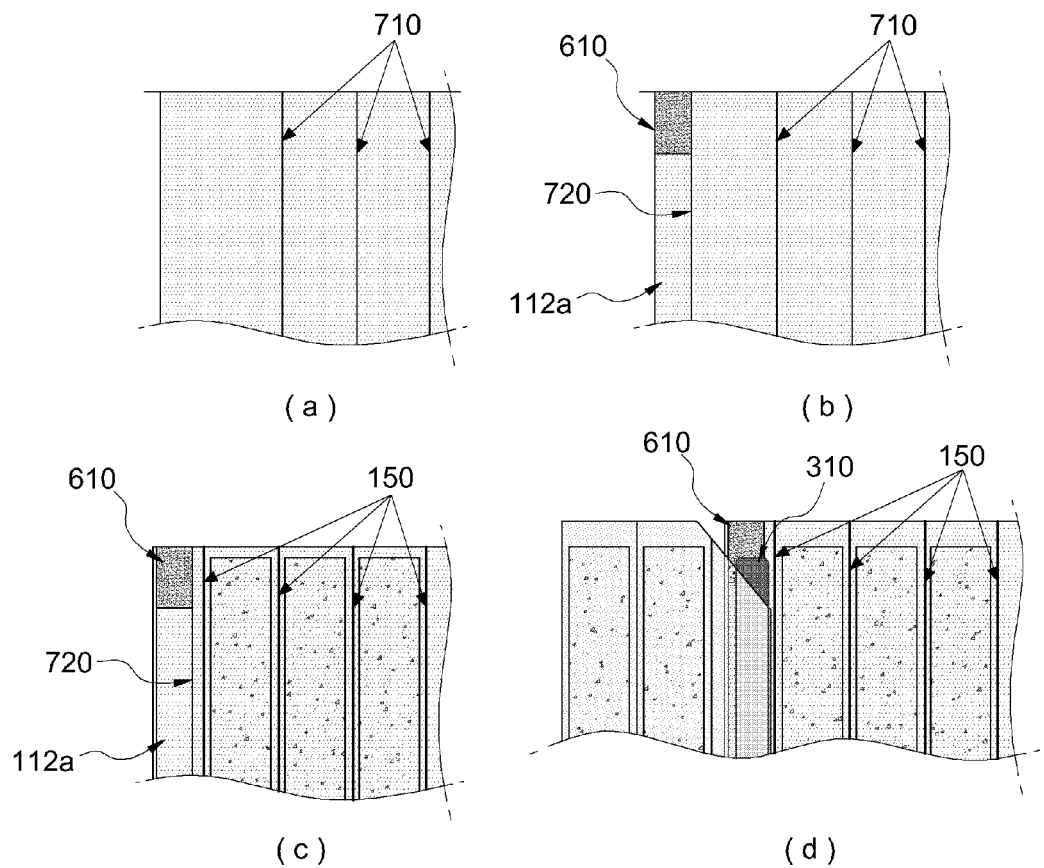
FIGS. 7A to 7D are diagrams illustrating a method of applying a conductive adhesive after forming a pattern for limiting a heated region in an electrode of a solar battery sub module.

As illustrated in FIG. 7A, the electrode of the glass substrate is divided into several parts by forming thin film electrode division parts 710 in the electrode of the glass substrate by a scribing or an etching. As illustrated in FIGS. 7C and 7D, each of the divided electrodes constitutes an individual cell through the partition walls 150 in the finally assembled solar battery sub module. In this case, the electrodes positioned on both end sides of the glass substrate constitute the independent cells and simultaneously function as external electrodes of the solar battery sub module, so that the electrodes positioned on both end sides of the glass substrate have wider widths than those of other adjacent divided electrodes.

Further, as illustrated in FIG. 7B, an additional division part 720 for limiting a current is formed in the electrode of the glass substrate. Accordingly, the current supplied for the heating of the conductive adhesive 310 flows only toward a heating electrode 112a including the electrode pad 610.

Figure 8:
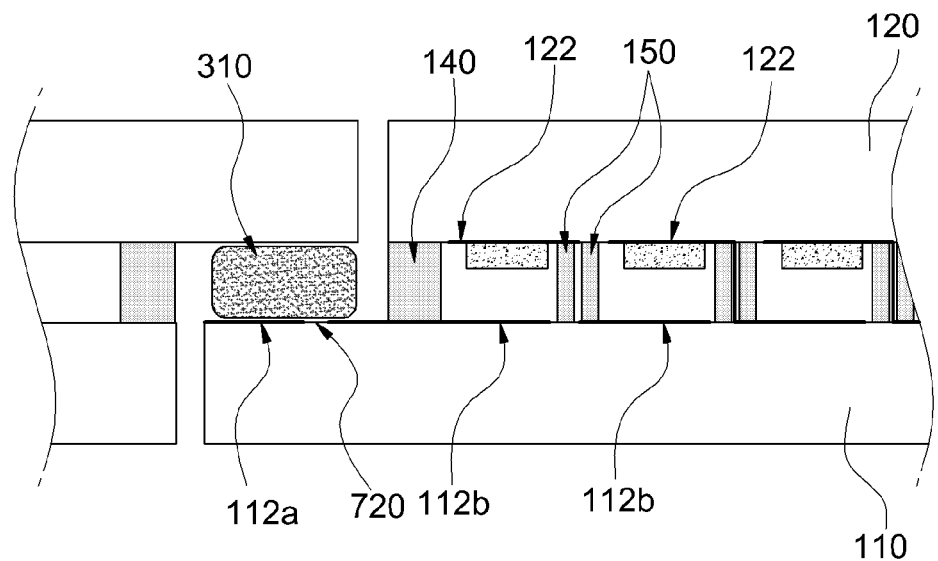
FIG. 8 is a diagram illustrating a process of heating and hardening a conductive adhesive after applying the conductive adhesive on an electrode of a glass substrate.

FIG. 8 is a diagram illustrating a process of heating and hardening the conductive adhesive after applying the conductive adhesive on the electrode of the glass substrate.

Referring to FIG. 8, the conductive adhesive 310 is applied so as to simultaneously cover the heating electrode 112a and adjacent electrodes 112b. Since the conductive adhesive 310 before hardening is in a state of a non-conductor or having a very high resistance value, the heating current flows only toward the heating electrode 112a in an outermost side, so that the local heating may be effectively performed.

Then, when a temperature around the heating electrode 112a reaches a hardening temperature of the conductive adhesive 310 by heat transfer of the glass substrate 110, the conductive adhesive 310 becomes hardened. Since the resistance value of the conductive adhesive 310, which has begun hardening, is sharply decreased, the current flowing through the heating electrode 112a comes to flow along the conductive adhesive 310. Further, since the conductive adhesive 310 is applied to the adjacent electrodes 112b, as well as the heating electrode 112a, the heating electrode 112a and the adjacent electrode 112b, which have been separated by the additional division part 720 for the limitation of the current, are electrically connected to each other according to the hardening of the conductive adhesive 310, so that the electric power may be withdrawn.

According to the method of manufacturing the dye sensitized solar battery according to the exemplary embodiment of the present disclosure, even though the additional division part 720 for separately limiting the current is formed in the electrode 112 of the solar battery sub module, the solar battery sub modules may be electrically and mechanically connected to each other by the hardening of the conductive adhesive 310.

Figure 9:
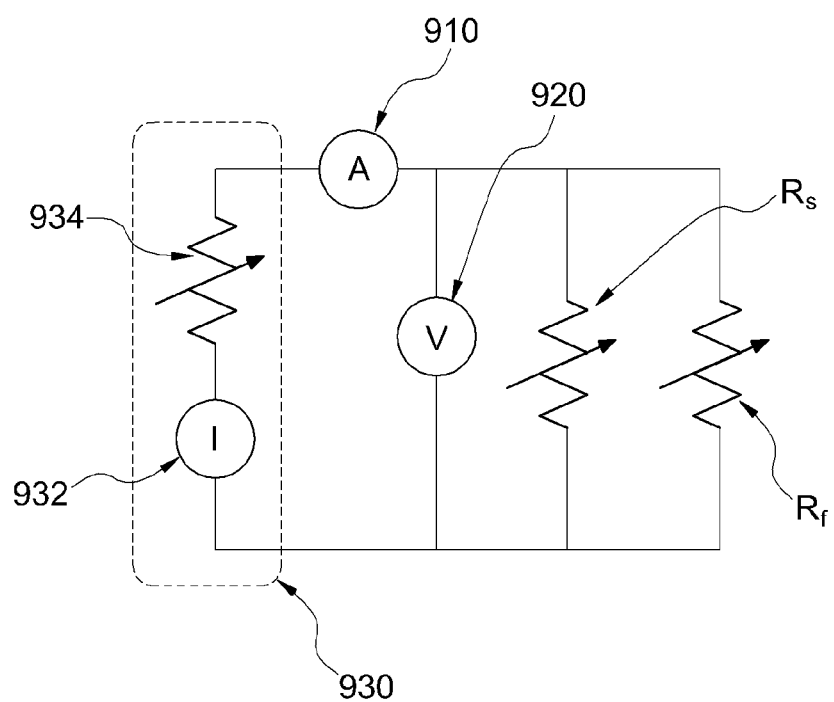
FIG. 9 is a circuit diagram of a solar battery assembling apparatus for hardening a conductive adhesive according to another exemplary embodiment of the present disclosure.

FIG. 9 is a circuit diagram of a solar battery assembling apparatus for hardening the conductive adhesive according to another exemplary embodiment of the present disclosure.

Referring to FIG. 9, $R_s$ represents resistance of the conductive adhesive, and $R_f$ represents resistance of the electrode. Since $R_s$ and $R_f$ are connected in parallel, an entire resistance value $R_T$ may be defined as $$\frac{1}{R_T} = \frac{1}{R_s} + \frac{1}{R_f}$$

according to the Ohm's law.

Since $R_s$ before the conductive adhesive hardens is very large or infinite ($R_s \gg R_f$), $R_T \approx R_f$ and the most currents flow through $R_f$.

When the conductive adhesive begins to be hardened by the heating, $R_s$ is sharply decreased and $R_s \ll R_f$, so that the most currents flow through $R_s$ and $R_T \approx R_s$.

Accordingly, in another exemplary embodiment of the present disclosure, contrary to hardening the conductive adhesive by adjusting a temperature of the connection part and a heating time, a hardened state of the conductive adhesive may be directly checked by monitoring a change in a current flowing in a heating circuit and a change in a voltage of a heating electrode by using an amperemeter 910 and a voltmeter 920.

Further, a change in heating power before the conductive adhesive hardens and heating power until the conductive adhesive completely hardens may be optimized by appropriately adjusting a voltage source 932 and resistance 934 of a power unit 930.

The exemplary embodiments disclosed in the specification of the present disclosure shall not limit the present disclosure. The scope of the present disclosure shall be construed by the claims below, and it shall be construed that all techniques within the scope equivalent thereto belong to the scope of the present disclosure.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a dye sensitized solar battery, comprising:
   forming electrode pads on electrodes of respective solar battery sub modules;
   forming a conductive adhesive on the electrode; and
   overlapping the electrodes of the solar battery sub modules, applying a current to the electrode pads, and then heating and hardening the conductive adhesive,
   wherein the electrode of each of the solar battery sub modules is separated into a heating electrode and a plurality of adjacent electrodes by a scribing or an etching, and
   wherein forming of the conductive adhesive comprises forming the conductive adhesive over the heating electrode and one of the plurality of adjacent electrodes.

2. The method of claim 1, wherein the heating electrode and the plurality of adjacent electrodes are electrically connected according to the hardening of the conductive adhesive.

* * * * *